United States Patent [19]

Seidler

[11] 4,367,910

[45] Jan. 11, 1983

[54] MINI-TERMINAL

[76] Inventor: Jack Seidler, 59-40 15th St., Flushing, N.Y. 11359

[21] Appl. No.: 230,907

[22] Filed: Feb. 2, 1981

[51] Int. Cl.³ .............................................. H01R 5/04
[52] U.S. Cl. ................................................. 339/275 B
[58] Field of Search .............. 339/17 C, 17 L, 17 LC, 339/258 R, 258 P, 275 R, 275 B, 275 T

[56] References Cited

U.S. PATENT DOCUMENTS

| | | | |
|---|---|---|---|
| 1,553,952 | 9/1925 | Nero | 339/258 R |
| 3,790,916 | 2/1974 | Keitel | 339/17 L |
| 4,120,558 | 10/1978 | Seidler | 339/275 T |
| 4,203,648 | 5/1980 | Seidler | 339/275 T |

Primary Examiner—Joseph H. McGlynn
Attorney, Agent, or Firm—DeLio and Libert

[57] ABSTRACT

A mini-terminal clip for attachment to a circuit bearing chip wherein the clip is made from strip stock of normal gage by folding the body along a line or lines parallel to the body's length, the free end of the body beyond the fold or folds being slit to form two or three fingers of the same or different lengths, and the fingers then being bent as required to provide a gap adapted to receive the edge of the circuit bearing chip. The gap may face laterally, at a 90° angle to the plane of the terminal body, or may be parallel to said plane, and one or more of the fingers may be provided with solder masses.

11 Claims, 16 Drawing Figures

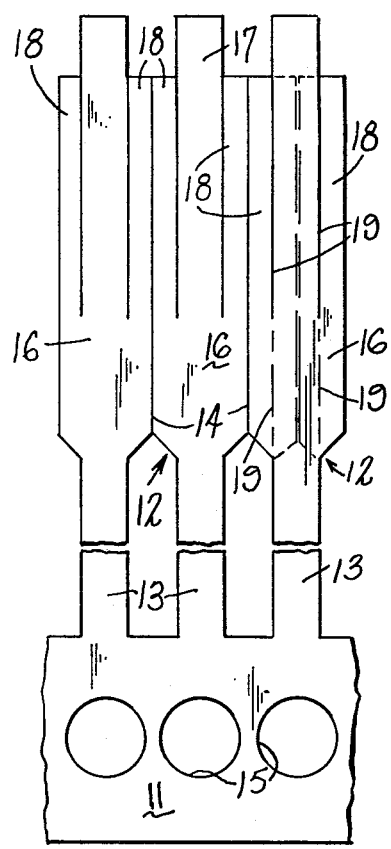
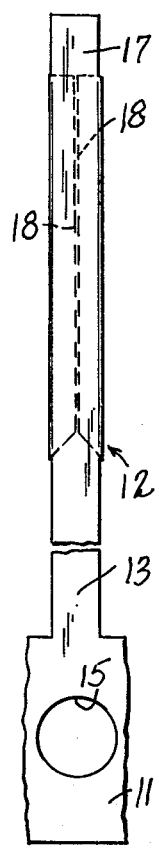
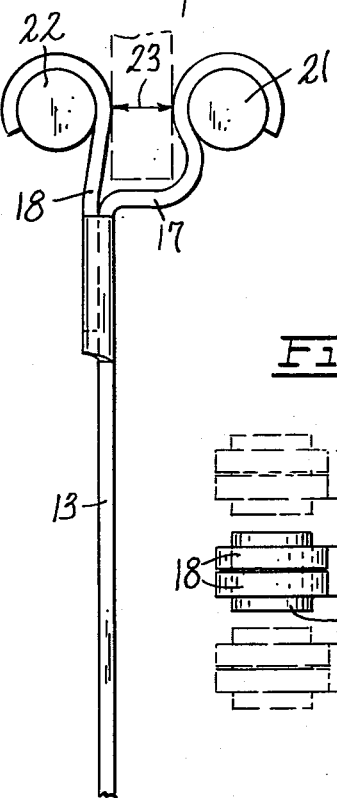
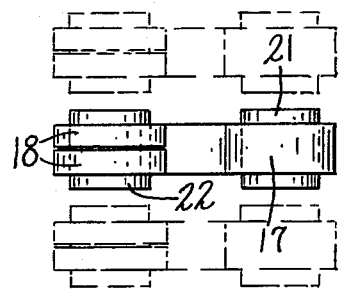
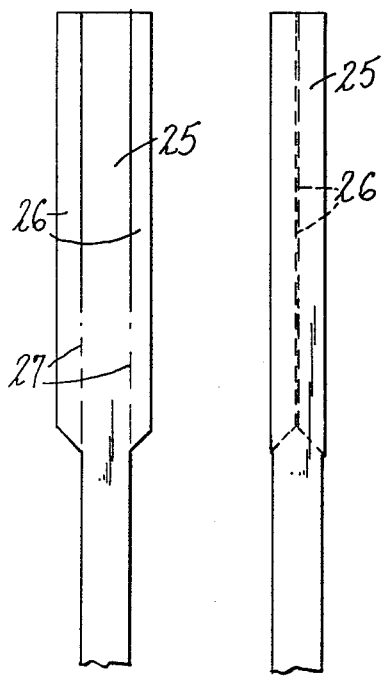
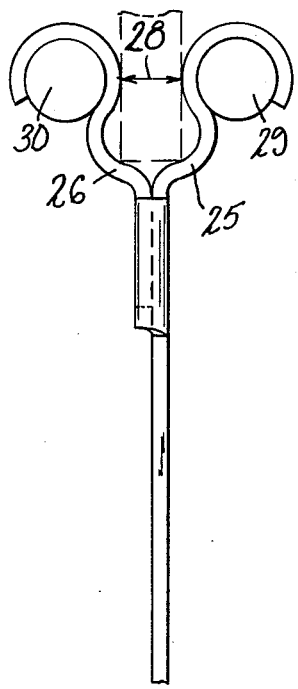
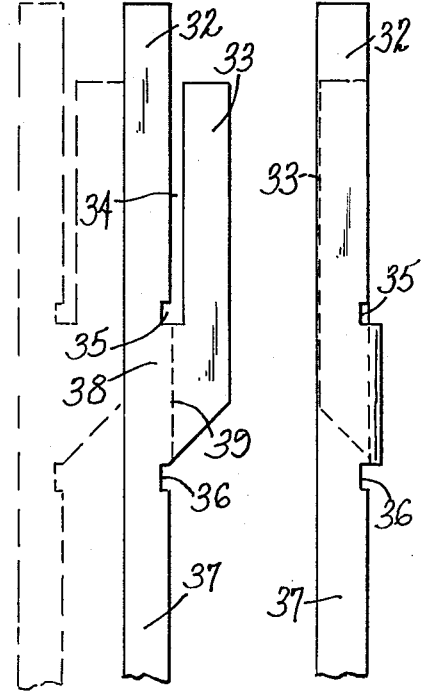

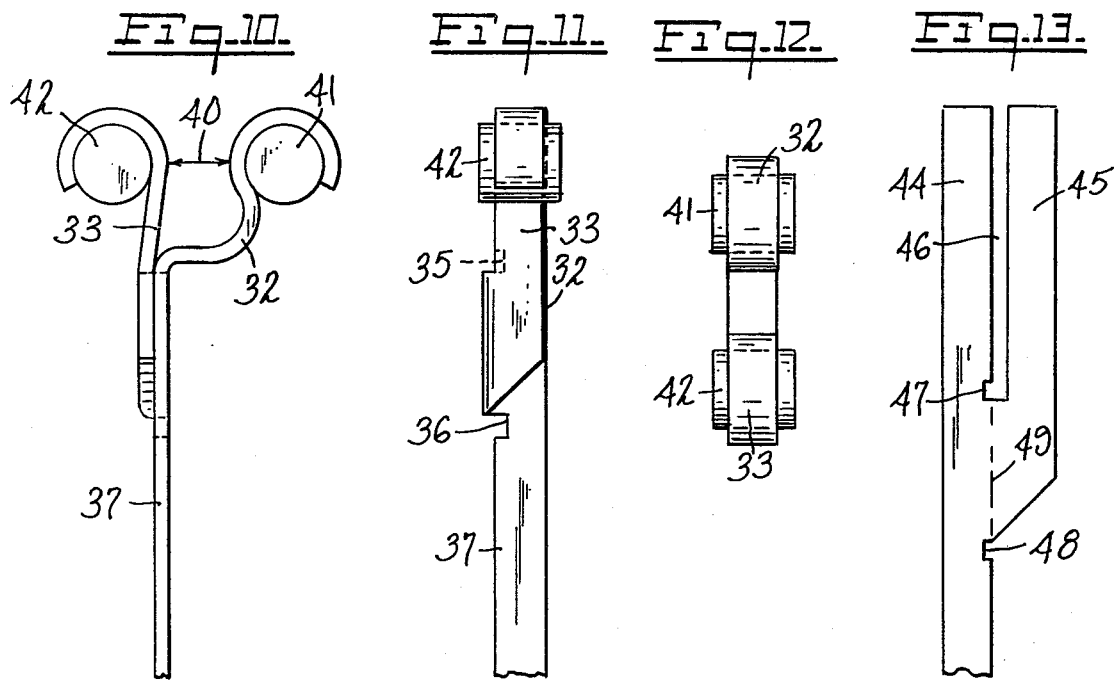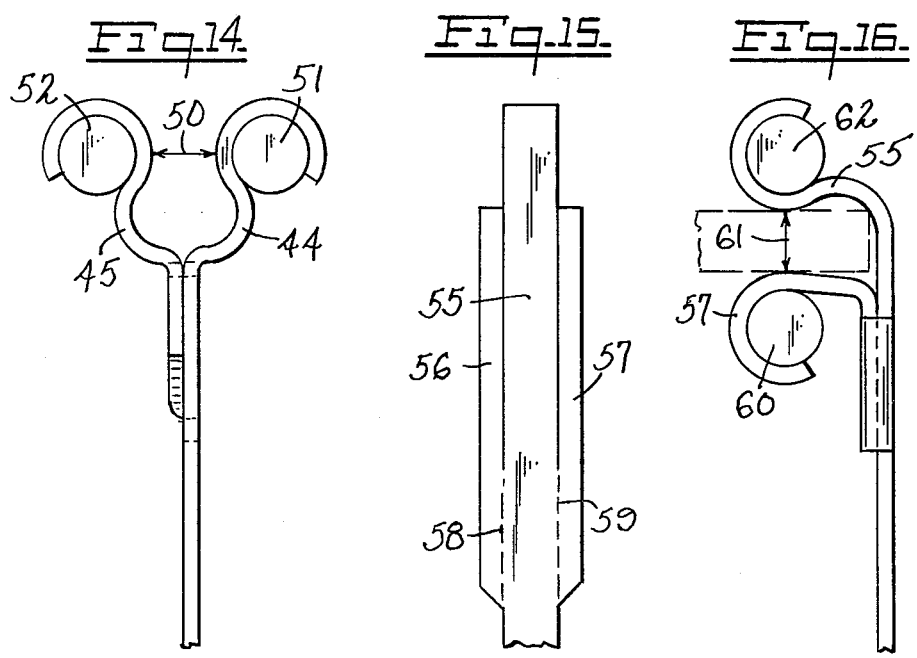

MINI-TERMINAL

This invention relates to a mini-terminal clip for attachment to a contact pad on a circuit bearing chip, the clip being preferably of the type wherein solder is mechanically engaged with the clip in a position to be melted for bonding the clip to the contact pad.

The invention will be described with particular reference to clips wherein a quantity of solder is associated with a terminal clip so that when the clip has been positioned on the contact pad of a circuit bearing chip and the assembly is heated, the molten solder covers the adjacent surfaces of the clip and pad to form, when cool, a soldered metallurgical joint between the clip and pad. Terminals of this type, with various arrangements of solder-holding and/or pad contacting fingers, are disclosed in Seidler U.S. Pat. Nos. 4,120,558 and 4,203,648, in each of which the body portion, from which the fingers are formed, is flat and wide enough so that each of the fingers (usually three) will have adequate strength for its intended purpose. Excessive bending of the fingers to their desired configuration may tend to cause work hardening of the metal and should be avoided.

Increasing commercial pressure for miniaturization in this field can be responded to by reducing the size and spacing (pitch) of the contact pads on a substrate, because such pads are fully supported by the material of the clip, but the terminals which are attached to the pads must have at least enough inherent strength to be self-supporting as they are applied, and to maintain good electrical contact with their respective pads while being soldered. It is not economical to consider increasing the gage of the strip from which terminals are stamped, since a very thin strip is electrically satisfactory.

It is accordingly an object of the present invention to provide a mini-terminal of the character described which is narrower than the terminals heretofore known, while being still stiff enough to meet the self-supporting requirement.

It is another object of the present invention to achieve the desired result by folding lengthwise the body from which the fingers are formed.

It is a further object of the invention to so proportion the body and fingers that all elements of the cut and folded terminal retain at least as much effective inherent strength as in the terminals now used.

It is yet another object of the invention to provide certain improvements in the form, construction and arrangement of the several elements by which the above named and other objects may effectively be achieved.

The invention accordingly comprises an article of manufacture possessing the features, properties, and the relation of elements which will be exemplified in the article hereinafter described, and the scope of the invention will be indicated in the claims.

The foregoing objects can be realized in terminals made from strip stock of normal gage by the expedient of folding the body along a line parallel to the body's length, the free end of the body beyond the fold being slit to form two or three fingers of the same or different lengths, and the fingers then being bent as required to provide a gap adapted to receive the edge of the circuit bearing chip. The gap may face laterally, at a 90° angle to the plane of the terminal body, or may be parallel to said plane, and one or more of the fingers may be provided with solder masses, as in the Seidler patents cited above.

Practical embodiments of the invention are shown in the accompanying drawings wherein:

FIG. 1 represents a plan view of a portion of a blank strip, cut to be formed into a first embodiment of the invention having fingers of unequal length, parts being broken away;

FIG. 2 represents a plan view of a single terminal, as shown in FIG. 1, with the side fingers folded against the middle finger;

FIG. 3 represents a detail side view, on a larger scale, of the free end of a terminal formed from a blank as shown in FIGS. 1 and 2, with solder masses added and the edge portion of a circuit bearing chip being shown in broken lines;

FIG. 4 represents a top plan view of the terminal shown in FIG. 3, with the positions of adjacent terminals indicated in broken lines;

FIG. 5 represents a detail plan view of the free end portion of a second form of blank, similar to those shown in FIGS. 1 and 2 but with three fingers of equal length;

FIG. 6 represents a detail plan view of the blank shown in FIG. 5, with the side fingers folded against the middle finger;

FIG. 7 represents a detail side view of the free end of a terminal formed from a blank as shown in FIGS. 5 and 6, with solder masses added and the edge portion of a circuit bearing chip being shown in broken lines;

FIG. 8 represents a detail plan view of the free end portion of a third form of blank having two fingers of different lengths, the position in the strip of an adjoining blank being indicated in broken lines;

FIG. 9 represents a detail plan view of the blank shown in FIG. 8 with the shorter side finger folded against the longer finger;

FIG. 10 represents a detail side view of the free end of a terminal formed from the blank as shown in FIGS. 8 and 9, with solder masses added;

FIG. 11 represents a detail side view of the terminal shown in FIG. 10, viewed from the left of said figure;

FIG. 12 represents a detail top view of the terminal shown in FIG. 10, viewed from the top of said figure;

FIG. 13 represents a detail plan view of the free end portion of a fourth form of blank having two fingers of the same length;

FIG. 14 represents a detail side view of the free end of a terminal formed from the blank shown in FIG. 13, with solder masses added;

FIG. 15 represents a detail plan view of the free end portion of a fifth form of blank having three fingers of different length, as in FIG. 1, and FIG. 16 represents a detail side view of the free end of a terminal formed from the blank shown in FIG. 15, with solder masses added and the position of the circuit-bearing chip being indicated in broken lines.

Referring to the drawings, and particularly to FIGS. 1 to 4 thereof, the terminal strip includes a continuous carrier strip 11 with individual terminal clips 12 connected thereto by stems 13 and separated from each other by severance lines 14. The carrier strip may be provided with pilot holes 15 at regular intervals, as is customary. As formed in the blank strip, each terminal includes a flat body portion 16, somewhat wider than the stem 13, the free end portion of the body being cut longitudinally to provide a middle finger 17 and side fingers 18, the width of each side finger being approximately half the width of the middle finger and the middle finger being substantially longer than the side fingers.

Each terminal blank so formed and dimensioned is subjected to a bending operation whereby the side fingers 18 are folded toward each other along fold lines 19 which are extensions across the body portion of the lines separating the side and middle fingers, each terminal after this folding operation being as shown in FIG. 2.

The terminal clip is completed (FIG. 3) by bending the longer middle finger 17 away from the shorter fingers 18 in an ogee curve with its free end embracing a cylindrical solder mass 21, while the shorter fingers 18 are bent in the opposite direction, arcuately, to embrace similarly another solder mass 22. The double curvature of the longer finger serves to provide a gap 23 which is dimensioned to receive, in frictional engagement, the edge portion of a circuit bearing chip, to the pads of which the terminal can be firmly attached by the melting of the solder masses.

The view represented in FIG. 4 serves to bring out the degree of compaction which can be achieved according to the invention by the provision of terminal clips narrowed by folding in of the side fingers. Contact pads on the chip can be (and are being) spaced very close together in some instances and the fine gage terminals made as described herein meet a real need.

The terminal shown in FIGS. 5, 6, and 7 is similar to that shown in FIGS. 1, 2, and 3, except that the middle finger 25 is the same length as the side fingers 26. The latter are folded toward each other along the lines 27 and their free ends are bent apart in symmetrical ogee curves to provide a gap 28 for receiving the edge of a circuit bearing chip. The end of the middle finger 25 embraces arcuately a solder mass 29 and the ends of the side fingers embrace similarly a solder mass 30.

In the third modified form of mini-terminal, shown in FIGS. 8 to 12, the two side fingers of the first form have been replaced by a single side finger. Here the "middle" finger 32 is (like finger 17) longer than the side finger 33, while the fingers are of the same width and separated by a cut 34 which terminates in a notch 35. Another notch 36 may be provided at the junction of the stem 37 with the body portion 38 to define precisely the ends of the fold line 39. The terminal clip is completed (like the clip of FIGS. 1 to 3) by bending the longer finger 32 away from the finger 33 in an ogee curve to form the gap 40, the free end of finger 32 embracing arcuately the solder mass 41 and the free end of the shorter finger 33 embracing arcuately the solder mass 42.

In FIGS. 13 and 14 there is shown a fourth modified form wherein the fingers of FIG. 8 are made of equal lengths, as in FIGS. 5 to 7. The "middle" finger 44 and side finger 45 have equal widths and are separated by a cut 46 terminating in a notch 47 (like notch 35). The lower notch 48 (like notch 36) defines the lower end of the fold line 49, as before. The free ends of the fingers are bent away from each other in complementary symmetrical ogee curves to form the gap 50, and solder masses 51, 52 are embraced by the outwardly arcuately bent ends of the fingers.

FIGS. 15 and 16 illustrate the adaptation of the invention to a terminal clip wherein the gap is facing in a direction at a right angle to the plane of the terminal body and connecting leg. In this form the blank is similar to those shown in FIG. 1, with a long middle finger 55 flanked by shorter side fingers 56, 57, each of which is approximately half the width of the middle finger. The side fingers are folded toward each other along the fold lines 58, 59, and their free ends are bent laterally away from the middle finger and wrapped around a solder mass 60. The free end of the middle finger is bent in an ogee curve in the same direction as the side fingers but spaced therefrom sufficiently to form the gap 61, the end of the middle finger turning away from the gap and embracing a solder mass 62.

The single side arm terminal of FIGS. 8 to 12 could also be constructed to have its gap at a 90° angle to the plane of the body, as will readily be understood by a comparison of FIG. 10 with FIG. 16.

FIGS. 1 and 8 show the cutting of terminal blanks without leaving any waste material between adjacent terminals. This not only promotes the close juxtaposition of adjacent terminals but also represents an efficient utilization of the strip stock by minimizing scrap.

Results similar to those achieved in the clips shown in FIGS. 3, 10, and 16 (unequal length fingers) would also be possible if the side finger or fingers were allotted and extra length and bent in the longer configuration.

While each of the terminals shown above is provided with a solder mass on each side of the gap, which is preferred, it will be understood that either or both of the solder masses may be omitted if desired and/or if soldering is to be effected in some other manner. It will be understood further that the solder masses, in each instance, may suitably be held securely by the respective fingers as described in Seidler U.S. Pat. No. 4,203,648, i.e., the finger being wrapped at least 180° around the solder mass and indented into the surface thereof.

As the use of smaller pitched circuits becomes more prevalent it will be found that the manufacturing of terminals according to the invention is compatible with pitches as small as 0.050" instead of 0.100" as commonly used heretofore. The reduction in size is effected, in each case, with no significant reduction of material, thus maintaining normal strength and conductivity.

It will thus be seen that the objects set forth above, among those made apparent from the preceding description, are efficiently attained and, since certain changes may be made in the above article without departing from the spirit and scope of the invention, it is intended that all matter contained in the above description and shown in the accompanying drawings shall be interpreted as illustrative and not in a limiting sense.

What I claim is:

1. A terminal clip for securement to a contact pad on a circuit bearing chip comprising an elongated clip body portion having a free end and a stem end, said body portion being cut longitudinally from the direction of the free end along at least one cut line to define at least two substantially parallel fingers, said body being folded along at least one fold line which is an extension across the body portion of said at least one cut line, said fingers being bent out of the plane of the body portion into positions defining a gap adapted to receive an edge portion of a circuit bearing chip and at least one finger being provided with a solder mass.

2. A terminal clip according to claim 1 wherein the body portion is cut longitudinally along two lines to define a middle finger and two side fingers, both side fingers and the body portion being folded toward each other along lines which are extensions of the cut lines to place the side fingers in side by side relation.

3. A terminal clip according to claim 2 wherein the total width of the side fingers substantially equals the width of the middle finger.

4. A terminal clip according to claim 2 or 3 wherein the side fingers are of equal length and the middle finger is of a different length.

5. A terminal clip according to claim 3 wherein the middle finger is longer than the side fingers.

6. A terminal clip according to claim 2 or 3 wherein the fingers are of equal length.

7. A terminal clip according to any one of claims 1 to 3 wherein fingers on both sides of the gap are provided with solder masses.

8. A terminal according to claim 1 wherein the body portion is cut longitudinally along one line to define two fingers of substantially equal width, said fingers being folded toward each other along a line which is an extension of the cut line and at least one finger being provided with a solder mass.

9. A terminal clip according to claim 8 wherein one finger is longer than the other.

10. A terminal clip according to claim 8 wherein the fingers are of equal length.

11. A terminal clip according to any one of claims 8, 9, or 10 wherein each finger is provided with a solder mass.

* * * * *